United States Patent
Itoh

(10) Patent No.: US 7,906,378 B2
(45) Date of Patent: Mar. 15, 2011

(54) EPOXY RESIN COMPOSITION FOR ENCAPSULATING SEMICONDUCTOR ELEMENT AND SEMICONDUCTOR DEVICE

(75) Inventor: Shingo Itoh, Tochigi (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 0 days.

(21) Appl. No.: 11/905,968

(22) Filed: Oct. 5, 2007

(65) Prior Publication Data

US 2008/0085969 A1 Apr. 10, 2008

(30) Foreign Application Priority Data

Oct. 6, 2006 (JP) ................................. 2006-274564

(51) Int. Cl.
*H01L 21/00* (2006.01)

(52) U.S. Cl. ......... 438/127; 524/451; 524/445; 525/523; 523/433

(58) Field of Classification Search .................... 523/443
See application file for complete search history.

(56) References Cited

U.S. PATENT DOCUMENTS

| | | | | | |
|---|---|---|---|---|---|
| 4,675,356 A | * | 6/1987 | Miyata | ........................... | 524/424 |
| 5,610,443 A | * | 3/1997 | Inagaki et al. | ................ | 257/788 |
| 5,919,844 A | * | 7/1999 | Shimizu et al. | ............... | 523/457 |
| 6,287,532 B1 | * | 9/2001 | Okada et al. | ............... | 423/420.2 |
| 2004/0232532 A1 | * | 11/2004 | Kuroda | ......................... | 257/678 |

FOREIGN PATENT DOCUMENTS

| | | | |
|---|---|---|---|
| GB | 2420561 A | * | 5/2006 |
| JP | 60-42418 | | 3/1985 |
| JP | 7-48500 | | 2/1995 |
| JP | 11-240937 | | 9/1999 |
| JP | 2001-234034 | | 8/2001 |
| JP | 2002-053735 | | 2/2002 |
| JP | 2002-80566 | | 3/2002 |
| JP | 2002-294032 | | 10/2002 |
| JP | 2002-371194 | | 12/2002 |
| JP | 2003-277579 | | 10/2003 |
| WO | 2005/097892 | | 10/2005 |

OTHER PUBLICATIONS

Bejoy (Resonance, Feb. 2001).*
International Search Report (PCT/ISA/210, PCT/ISA/237 and PCT/ISA/220 forms).

* cited by examiner

*Primary Examiner* — Randy Gulakowski
*Assistant Examiner* — Shane Fang
(74) *Attorney, Agent, or Firm* — Smith, Gambrell & Russell, LLP

(57) ABSTRACT

An epoxy resin composition for encapsulating a semiconductor element and a semiconductor device manufactured using the epoxy resin composition are provided. The epoxy resin composition includes epoxy resin, a curing agent, at least one kind of an inorganic filler selected from the group consisting of silicates such as talc and calcined clay, oxides such as silica and fused silica, and hydroxides such as aluminum hydroxide and magnesium hydroxide, and a pH buffer agent having a pH buffer area of pH 4 to 8. Further, the semiconductor device is manufactured by encapsulating at least one semiconductor element with a cured product of the above epoxy resin composition. Such a semiconductor device can have excellent moisture resistance.

10 Claims, No Drawings

EPOXY RESIN COMPOSITION FOR ENCAPSULATING SEMICONDUCTOR ELEMENT AND SEMICONDUCTOR DEVICE

BACKGROUND OF THE INVENTION

1. Field of the Invention

The present invention relates to an epoxy composition for encapsulating a semiconductor element and a semiconductor device, and more specifically relates to an epoxy composition for encapsulating a semiconductor element and a semiconductor device formed using the epoxy composition.

2. Description of the Related Art

Until now, a semiconductor element incorporated in (provided in) a semiconductor device is encapsulated using an epoxy resin composition which is prepared by mixing a curing agent such as phenol resin and an inorganic filler such as fused silica or crystallized silica with epoxy resin having excellent heat resistance and moisture resistance.

Recently, in accordance with high level integration of an integrated circuit, a size of a semiconductor device becomes larger. In addition, a surface mounting type semiconductor device such as TSOP, TQFP or BGA are widely used. Such a surface mounting type semiconductor device is mounted on a substrate through a reflow soldering, and thus the semiconductor device is required to have higher heat stress resistance for the reflow soldering than that of a conventional semiconductor device due to its increased size.

In such a surface mounting type semiconductor device, due to the heat stress which would occur during the reflow soldering, there is a problem in that a crack is likely to be generated in the semiconductor device (a cured product of the epoxy resin composition), or delamination is likely to occur at a boundary surface between the semiconductor element and the cured product or a boundary surface between a structural element other than the semiconductor element and the cured product. Therefore, it is strongly demanded that an epoxy resin composition having excellent heat resistance is developed.

Further, in order to cope with the recent environmental problems, as for a solder used in a reflow soldering, one having a low lead content is preferably used. However, use of such a solder requires a higher temperature in a reflow soldering process. As a result, it is required that the epoxy resin composition used in such a surface mounting type semiconductor device has more excellent reflow soldering resistance which includes low stress property and low hygroscopicity in addition to high heat resistance.

For these reasons, as an epoxy resin composition to be used for the surface mounting type semiconductor device, recently, epoxy resin having excellent low stress property and excellent low hygroscopicity which are lower than those of conventionally used orthocresol novolak type epoxy resin and phenol novolak type resin is used.

However, in the case where such an epoxy resin is used, due to the chemical structure thereof, a glass-transition temperature of a cured product of the epoxy resin composition containing the epoxy resin is lower than that of an epoxy resin composition containing orthocresol novolak epoxy type resin and phenol novolak type resin.

In the case where the glass-transition temperature is low, since moisture content is relatively easily penetrated into the cured product under a humid condition, ionic impurities such as $Cl^-$ contained in the epoxy resin composition are easily movable in a semiconductor device formed using it. As a result, corrosion of the integrated circuit included in the semiconductor device is likely to occur due to contact with the ionic impurities. This means that the semiconductor device formed using such an epoxy resin composition cannot have sufficient moisture resistance that is required to maintain a function of the semiconductor device under the humid condition.

In order to trap the ionic impurities which cause corrosion of the integrated circuit, it is proposed that an ion scavenger containing Bi-based inorganic compound is mixed with the epoxy resin composition (JP-A 11-240937, pages 2 to 11), a magnesium oxide-based or aluminum oxide-based ion scavenger is mixed with the epoxy resin composition (JP-A 60-42418, pages 2 to 4), or a zirconium-based ion scavenger is mixed with the epoxy resin composition (JP-A 2002-371194, pages 2 to 6).

In these approaches, each epoxy resin composition could have slightly improved moisture resistance, but a degree of the improvement of the moisture resistance is not necessarily to be a satisfactory level.

SUMMARY OF THE INVENTION

It is an object of the present invention to provide an epoxy resin composition for encapsulating a semiconductor element which can manufacture a semiconductor device having excellent moisture resistance, and a semiconductor device manufactured using the epoxy resin composition.

In order to achieve the object described above, the present invention is directed to an epoxy resin composition for encapsulating a semiconductor element. The epoxy resin composition comprises epoxy resin, a curing agent, at least one kind of an inorganic filler selected from the group consisting of silicates such as talc and calcined clay, oxides such as silica and fused silica, and hydroxides such as aluminum hydroxide and magnesium hydroxide, and a pH buffer agent having a pH buffer area of pH 4 to 8.

Further, in the present invention, it is preferred that the pH buffer agent contains hydrotalcite.

Furthermore, in the present invention, it is also preferred that the hydrotalcite contains semicalcined hydrotalcite.

Moreover, in the present invention, it is also preferred that when a weight reduction rate of the hydrotalcite is measured using a thermogravimetry, and then the weight reduction rate at 250° C. is defined by A wt % and the weight reduction rate at 200° C. is defined by B wt %, A and B satisfy a relation of A-B≦5 wt %.

Moreover, in the present invention, it is also preferred that when the weight reduction rate at 450° C. is defined by C wt %, A and C satisfy a relation of C-A≧5 wt %.

Moreover, in the present invention, it is also preferred that the hydrotalcite has a plurality of layers in a crystal thereof, an amount of water existing between the layers is 5 wt % or less, and an amount of carbonate ions existing between the layers is 5 wt % or more.

Moreover, in the present invention, it is also preferred that a specific surface area of the hydrotalcite is in the range of 30 to 60 m²/g.

Moreover, in the present invention, it is also preferred that the hydrotalcite is subjected in advance to a heat treatment under conditions that a temperature is in the range of 200 to 400° C. and a time is in the range of 30 minutes to 24 hours.

Moreover, in the present invention, it is also preferred that an amount of the pH buffer agent in the entirety of the epoxy resin composition is in the range of 0.01 to 3 wt %.

Moreover, in the present invention, it is also preferred that when the epoxy resin composition is cured to obtain a cured product thereof, the cured product is subjected to an extraction operation using water which is heated, and then pH of the water after the extraction operation is measured, the pH of the water is in the range of 4 to 9.

Another aspect of the present invention is directed to a semiconductor apparatus. The semiconductor apparatus is manufactured by encapsulating at least one semiconductor element with a cured product of the above epoxy resin composition of the present invention.

DETAILED DESCRIPTION OF THE INVENTION

Hereinafter, the epoxy resin composition for encapsulating a semiconductor element and the semiconductor device according to the present invention will be described.

The epoxy resin composition for encapsulating a semiconductor element of the present invention comprises epoxy resin, a curing agent, at least one kind of an inorganic filler selected from the group comprising silicates such as talc and calcined clay, oxides such as silica and fused silica, and hydroxides such as aluminum hydroxide and magnesium hydroxide, and a pH buffer agent having a pH buffer area of pH 4 to 8.

Further, the semiconductor device of the present invention is manufactured by encapsulating at least one semiconductor element with a cured product of the epoxy resin composition described above.

First, the epoxy resin composition for encapsulating a semiconductor element (hereinafter, it will be referred to as "epoxy resin composition") will be described.

The epoxy resin composition of the present invention includes epoxy resin.

The epoxy resin may be either of monomers, oligomers or polymers each having two or more epoxy groups in one molecule, and there is no limitation on the types of the epoxy resin as long as it has two or more epoxy groups in one molecule.

Specifically, examples of the epoxy resin include biphenyl type epoxy resin, stilbene type epoxy resin, bisphenol type epoxy resin such as bisphenol A type epoxy resin or bisphenol F type epoxy resin, triphenol methane type epoxy resin, alkyl-denatured triphenol methane type epoxy resin, dicyclopentadiene-denatured phenol type epoxy resin, epoxy resin containing triazine structures, phenol aralkyl type epoxy resin, naphthol type epoxy resin, novolak type epoxy resin such as phenol novolak type epoxy resin or cresol novolak type epoxy resin, and they can be used alone or in combination of two or more of them.

Among these epoxy resins, in the case where the cured product of the epoxy resin composition is required to have solder resistance, crystalline epoxy resin such as biphenyl type epoxy resin, bisphenol type epoxy resin or stilbene type epoxy resin is preferably used as the epoxy resin. This is because since the crystalline epoxy resin is in the form of solid at normal temperature (room temperature) or in the form of liquid having very low viscosity at a temperature of its melting point or higher, the epoxy resin composition can contain an inorganic filler in a high loading.

Further, in order to increase the content (blending amount) of the inorganic filler, even in the case where epoxy resins other than the crystalline epoxy resin are used, it is preferred that epoxy resins each having a viscosity as low as possible are selected.

Furthermore, in the case where the cured product of the epoxy resin composition is required to have flexibility and low hygroscopicity, dicyclopentadiene type epoxy resin is preferably used as the epoxy resin. This is because the dicyclopentadiene type epoxy resin has a dicyclopentadiene structure having no epoxy groups and exhibiting hydrophobicity between aromatic rings each bonding at least one epoxy group.

Moreover, in the case where the cured product of the epoxy resin composition is required to have higher solder resistance, aralkyl type epoxy resin such as phenol aralkyl type epoxy resin or naphthol aralkyl type epoxy resin is preferably used as the epoxy resin. This is because the aralkyl type epoxy resin has a phenylene structure or biphenylene structure having both of hydrophobicity and high heat resistance between aromatic rings each bonding at least one epoxy group.

Considering moisture resistance in order to use the epoxy resin composition for encapsulating a semiconductor element, it is preferred that the epoxy resin composition contains ionic impurities such as Na ions and Cl ions as low as possible. Specifically, the amount of the ionic impurities contained in the entire of the epoxy resin composition is preferably 2 wt % or less, and more preferably 1 wt % or less. By setting the amount of the ionic impurities to the above range, an epoxy resin composition from which a cured product (semiconductor device) having more excellent moisture resistance is formed can be obtained.

The amount of the epoxy resin contained in the entire of the epoxy resin composition is, but not limited thereto, preferably in the range of 1 to 30 wt %, and more preferably in the range of 3 to 20 wt %. By setting the amount of the epoxy resin to the above range, an epoxy resin composition having especially excellent flowability and cureability can be obtained.

The epoxy resin composition further includes a curing agent.

The curing agent is generally classified into three types comprising a polyaddition type, a catalyst type and a condensation type.

Examples of the polyaddition type curing agent include aliphatic polyamines such as diethylene triamine (DETA), triethylene tetramine (TETA) and metaxylene diamine (MXDA), aromatic polyamines such as diamino diphenylmethane (DDM), m-phenylene diamine (MPDA) and diamino diphenylsulfone (DDS), polyamine compounds each containing dicyan diamide (DICY) or organic acid dihydrazide, acid anhydrides such as aliphatic acid anhydride (e.g., hexahydro phthalic anhydride (HHPA) or methyl hexahydro phthalic anhydride (MTHPA)) and aromatic acid anhydride (e.g., trimellitic anhydride (TMA), pyromellitic anhydride (PMDA) or benzophenone tetracarboxylic acid (BTDA)), polyphenol compounds such as novolak type phenol resin and phenol polymer, polymercaptan compounds such as polysulfide, thioester and thioether, isocyanate compounds such as isocyanate prepolymer and blocked isocyanate, and organic acids such as polyester resin containing carboxylic acid.

Examples of the catalyst type curing agent include tertiary amine compounds such as benzyl dimethylamine (BDMA), 2,4,6-tris dimethylamino methylphenol (DMP-30), imidazole compounds such as 2-methylimidazole, 2-ethyl-4-methylimidazole (EMI24), and Lewis acids such as EF3 complex.

Examples of the condensation type curing agent include phenol resins, urea resins such as urea resin containing methylol groups, and melamine resin containing methylol groups.

Further, these curing agents can be used alone or in combination of two or more of them depending on the kind of the epoxy resin to be used or the desired properties of the cured product of the epoxy resin composition. In this regard, it is to be noted that the phenol resin is preferably used among the above curing agents.

The phenol resin may be either of monomers, oligomers or polymers each having two or more phenol groups in one molecule, and there is no limitation on the types of the phenol resin as long as it has two or more phenol groups in one molecule.

Examples of the phenol resin include dicyclopentadiene-denatured phenol resin, phenol aralkyl resin, naphthol aralkyl resin, phenol novolak resin, cresol novolak resin, terpene-denatured phenol resin, and triphenol methane type resin, and they can be used alone or in combination of two or more of them.

The blending amount of the phenol resin in an equivalent ratio of the number of hydroxyl groups contained in the entire of the phenol resin with respect to the number of epoxy groups contained in the entire of the epoxy resin is preferably in the range of 0.8 to 1.4, more preferably in the range of 0.95 to 1.3, and even more preferably in the range of 1.0 to 1.25. By setting the equivalent ratio to the above range, an epoxy resin composition from which a cured product having especially excellent solder crack resistance is formed (produced) can be obtained.

The epoxy resin composition further includes at least one kind of an inorganic filler selected from the group consisting of silicates such as talc and calcined clay, oxides such as silica and fused silica, hydroxides such as aluminum hydroxide and magnesium hydroxide. By including the inorganic filler, it is possible to obtain an epoxy resin composition from which a cured product having low water absorbing property and improved strength and dimensional stability is formed.

Examples of the silicate include uncalcined clay, mica and glass, in addition to the talc and the calcined clay. Examples of the oxide include spherical silica, crystalline silica, secondary agglomerated silica, porous silica, silica produced by crushing secondary agglomerated silica or porous silica, titanium oxide and alumina, in addition to the silica and the fused silica.

Examples of the hydroxide include calcium hydroxide, in addition to the aluminum hydroxide and the magnesium hydroxide. In this regard, it is to be noted that the above compounds may be used alone or in combination of two or more of them.

Among these compounds, the oxide as represented by the silica or the fused silica is preferably used as the inorganic filler. Especially, the fused silica is more preferably used as the inorganic filler. Use of the oxide (especially, fused silica) makes it possible to improve flowability of the epoxy resin composition during molding it.

The shape of the inorganic filler may be irregular or spherical. In this regard, spherical fused silica is preferably used as the inorganic filler, because the spherical fused silica has superior flowability, mechanical strength and thermal property in a suitable balance. Further, a spherical fused silica subjected in advance to a surface treatment using a coupling agent may be used.

The amount of the inorganic filler contained in the entire of the epoxy resin composition is, but not limited thereto, preferably in the range of 70 to 98 wt %, and more preferably in the range of 75 to 95 wt %. By setting the amount of the inorganic filler to the above range, an epoxy resin composition having excellent moldability and reliability in a suitable balance can be obtained.

The maximum particle size of the inorganic filler and the amount of the inorganic filler having the maximum particle size (that is, coarse particles) are not limited to specific values. However, preferably, the amount of coarse particles each having particle size of 105 μm or more is 1% or less, and more preferably, the amount of coarse particles each having particle size of 75 μm or more is 1% or less.

This makes it possible to prevent effectively occurrence of disadvantages such as short circuit between two adjacent wires which would occur due to contact of these wires. In this regard, the contact results from wire sweep due to sticking of the coarse particles therebetween.

The epoxy resin composition further includes a pH buffer agent having a pH buffer area of pH 4 to 8. In the case where the pH buffer agent is contained in the epoxy resin composition, the moisture resistance of the cured product thereof can be improved. The reason why the moisture resistance of the cured product is improved is supposed as follows.

Normally, a wire contained in a semiconductor device is formed from aluminum. Aluminum has a characteristic that is easily dissolved and corroded in a strong acidic region where pH is 4 or less or in a strong alkaline region where pH is more than 9. Here, in the case where the cured product of the epoxy resin composition encapsulating the semiconductor element is placed under severe humidity and temperature conditions, there is a case that chlorine is generated by hydrolysis contained in the epoxy resin. In such a case, there is a case that pH of water (moisture) existing in the cured product of the epoxy resin composition reaches within the above pH range and the wire is dissolved and corroded by the strong acidic or alkaline water.

On the other hand, by adding the pH buffer having a pH buffer area of pH 4 to 8 to the epoxy resin composition, even in the case where chlorine is generated by hydrolysis in the cured product of the epoxy resin composition, the time it takes pH of water existing in the cured product to reach within the strong acidic region or strong alkaline region can be extended due to buffer action of the pH buffer agent. This makes it possible to improve the moisture resistance of the cured product of the epoxy resin composition.

The pH buffer area of such a pH buffer agent is preferably in the range of 4 to 7, and more preferably in the range of 4 to 6. By selecting the pH buffer agent having the pH buffer area of the above range, even in the case where the cured product of the epoxy resin composition is placed under higher temperature and higher humidity condition, the cured product can exhibit excellent moisture resistance.

In this regard, it is to be noted that whether the pH buffer area is in the range of 4 to 8 or not is evaluated as follows. Specifically, a liquid solution is first prepared by mixing 500 mg of the buffer agent, 225 mL of purified water and 25 mL of 1N—NaCl water solution. And then 25 mL of 1N—HCl is added to the liquid solution and the liquid solution is stirred. Next, the liquid solution is placed for 15 minutes, and then pH of the liquid solution is measured using a pH meter.

Examples of the buffer agent having a pH buffer area of pH 4 to 8 include hydrotalcite, citric acid/sodium citrate, tartaric acid/sodium tartrate, acetic acid/sodium acetate. Among them, the hydrotalcite is preferably used as the buffer agent. Use of the hydrotalcite makes it possible to further improve the moisture resistance of the cured product of the epoxy resin composition.

The hydrotalcite has a plurality of layers in a crystal thereof and retains carbonate ions and water (moisture) between the layers. By having such a structure, the hydrotalcite exhibits pH buffer action. Namely, by releasing the carbonate ions having pH buffer action into water existing in the cured product of the epoxy resin composition, pH of the water can be maintained in the range of 4 to 8.

Therefore, in the case where chlorine is generated by hydrolysis and released into water existing in the cured product of the epoxy resin composition so that pH of the water is sifted toward an acidic region, the carbonate ions are released from the hydrotalcite into the water or metallic hydroxide constituting the hydrotalcite is dissolved into the water. This makes it possible to neutralize the water and stabilize pH thereof.

Further, it is expected that corrosive chlorine ions in the water can be exchanged by the carbonate ions existing between layers of the hydrotalcite.

Examples of the hydrotalcite include uncalcined hydrotalcite, calcined hydrotalcite, and semicalcined hydrotalcite which is an intermediate of the calcined hydrotalcite, but the semicalcined hydrotalcite is preferably used as the hydrotalcite. By using the semicalcined hydrotalcite, the buffer action of the pH buffer agent can be further improved.

In such a semicalcined hydrotalcite, since the water existing between the layers and strongly adsorbed thereto is removed by a heat treatment for semi-calcining the hydrotalcite, the carbonate ions are easily released and the metallic hydroxide is easily dissolved so that neutralization efficiency becomes high.

Specifically, in the case of the uncalcined hydrotalcite, the carbonate ions cannot be released efficiently due to influence of the water existing between layers thereof, whereas in the case of the calcined hydrotalcite, the amount of the remaining carbonate ions is reduced due to calcination. For these reasons, the semicalcined hydrotalcite is especially preferable since it can release a great amount of carbonate ions.

In this regard, in the case where the hydrotalcite is subjected to a semicalcined process and then the obtained semicalcined hydrotalcite is placed at room temperature, a little water is slightly adsorbed to the semicalcined hydrotalcite. However, the pH buffer action of the semicalcined hydrotalcite is not affected by such an adsorbed water.

Preferably, the semicalcined hydrotalcite is obtained by subjecting hydrotalcite to a heat treatment under conditions that a temperature is in the range of 200 to 400° C. and a time is in the range of 30 minutes to 24 hours, and more preferably obtained by subjecting hydrotalcite to a heat treatment under conditions that a temperature is in the range of 250 to 350° C. and a time is in the range of 30 minutes to 24 hours.

By subjecting the hydrotalcite to the heat treatment under the above conditions, semicalcined hydrotalcite that can exhibit excellent pH buffer action can be obtained. In this regard, if the temperature is lower than the lower limit values, there is a case that it is difficult to sufficiently remove the water existing between the layers of the hydrotalcite, whereas if the temperature exceeds the upper limit values, there is a case that the carbonate ions are also removed from the hydrotalcite unnecessarily.

When the weight reduction rate of the hydrotalcite is measured using a thermogravimetry, and then the weight reduction rate at 250° C. is defined by A wt % and the weight reduction rate at 200° C. is defined by B wt %, A and B satisfy preferably the relation of A-B≦5 wt %, and more preferably the relation of A-B≦4 wt %. By satisfying the above relation of A-B, since the water existing between the layers of the hydrotalcite is adequately removed therefrom, such a hydrotalcite can exhibit excellent pH buffer action.

Further, when the weight reduction rate at 450° C. is defined by C wt %, A and C satisfy preferably the relation of C-A≧5 wt %, and more preferably the relation of C-A≧8 wt %. Here, it is supposed that hydrotalcite has a plurality of layers formed by binding hydroxide ions to aluminum ions and magnesium ions via ionic bonds, and spaces (gaps) for trapping the chlorine ions between the layers formed by the carbonate ions. Therefore, by satisfying the above relation of C-A, it is possible to improve especially chlorine ion adsorption (trap) capacity of such a hydrotalcite.

In this regard, since the semicalcined hydrotalcite satisfies both of the relation of A-B and the relation of C-A reliably, the semicalcined hydrotalcite can be preferably used as the hydrotalcite.

Furthermore, in the hydrotalcite, the amounts of the water and the carbonate ions existing between the layers thereof are preferably 5 wt % or less and 5 wt % or more, respectively, and more preferably 4 wt % or less and 8wt % or more, respectively, but are not limited thereto. In the case where the hydrotalcite contains the water and the carbonate ions within the above amount ranges, the hydrotalcite can exhibit especially excellent pH buffer action within the area of pH 4 to 8.

Moreover, the specific surface area of the hydrotalcite (especially, semicalcined hydrotalcite) is preferably in the range of 30 to 60 m²/g, more preferably in the range of 35 to 58 m²/g, and even more preferably in the range of 37 to 55 m²/g, but is not limited thereto. The hydrotalcite having the specific surface area of the above range has especially excellent chlorine ion adsorption capacity.

In this regard, the specific surface area can be measured using a commercially available specific surface area meter (for example, "MACSORB HM-MODEL-1201" produced by MOUNTECH Co., Ltd.). Further, for example, the thermogravimetry can be carried out at a programming rate of 20° C./min.

Such a hydrotalcite is represented by the following formula (1).

$$M_a Al_b(OH)_{2a+3b-2c}(CO_3)_c \cdot mH_2O \qquad (1)$$

wherein M is metal containing at least Mg, $2 \leqq a \leqq 8$, $1 \leqq b \leqq 3$, $0.5 \leqq c \leqq 2$, and m is an integer of 0 or more.

The amount of the hydrotalcite in the entirety of the epoxy resin composition is preferably in the range of 0.01 to 3 wt %, and more preferably in the range of 0.05 to 2 wt %, but is not limited thereto. If the amount of the hydrotalcite is smaller than the lower limit values, there is a case that an effect of inhibiting corrosion of aluminum is reduced, that is, it becomes difficult to improve the moisture resistance of the cured product of the epoxy resin composition satisfactorily. On the other hand, if the amount of the hydrotalcite exceeds the upper limit values, there is a case that coefficient of moisture absorption of the cured product of the epoxy resin composition becomes large, as a result of which solder crack resistance of the cured product (semiconductor device) is decreased.

In this regard, it is to be noted that a corrosion inhibitor of aluminum may be used in addition to the pH buffer agent.

Further, it is preferred that the epoxy resin composition includes a curing accelerator optionally.

As for the curing accelerator, various kinds of curing accelerators which are used as a general encapsulating material (mold material) can be used as long they can promote a reaction (curing reaction) of an epoxy group and a phenolic hydroxyl group.

Examples of the curing accelerator include 1,8-diazabicyclo(5,4,0)undecene-7,2-methylimidazole, triphenylphosphine and tetraphenylphosphonium·tetraphenylborate salt, but the curing accelerator is not limited thereto. And they can be used alone or in combination of two or more of them.

The epoxy resin composition of the present invention may optionally include various kinds of addition agents in addition to the epoxy resin, the curing agent, the inorganic filler and the pH buffer agent. Examples of such an addition agent include coupling agents such as silane coupling agent, coloring agents such as carbon black and colcothar, mold releasing agents such as natural wax and synthetic wax, flame retardants such as aluminum hydroxide, magnesium hydroxide, zinc borate, zinc molybdate and phosphazene, and low stress components such as silicone oil and rubber.

The epoxy resin composition of the present invention can be prepared by mixing the above mentioned materials (raw materials) adequately and uniformly using a blender. Further, the epoxy resin composition can be prepared by mixing the above mentioned materials to obtain a mixture thereof, melting and kneading the mixture using a heating roll or a kneader to obtain a kneading material, cooling the kneading material, and then crushing it.

By preparing the epoxy resin composition in this way, dispersity of each raw material in the epoxy resin composition can be adjusted adequately. These epoxy resin compositions are used for covering a transistor or an integrated circuit, for isolating it, or for encapsulating it.

When a cured product of the thus obtained epoxy resin composition is subjected to an extraction operation using water which is heated, and then pH of the water after the extraction operation is measured, the pH of the water is preferably in the range of 4 to 9, and more preferably in the range of 5 to 7. In the case where the pH of the water satisfies the above range, it can be evaluated that such a cured product of the epoxy resin composition has excellent moisture resistance.

Specifically, the extraction operation and measurement of pH can be carried out as follows. Namely, an epoxy resin composition is first cured at 175° C. for 8 hours to obtain a cured product thereof, and then the cured product is crushed to obtain a crushed product. Next, purified water is added to 5 g of the crushed product to obtain 50 g of a mixture, and then the mixture is set in a container having pressure resistance and placed under PCT conditions (a temperature is 125° C. and a pressure is $2.2 \times 10^5$ Pa) for 20 hours. Thereafter, pH of the purified water is measured using a pH meter ("HM-30S" produced by DKK-TOA CORPORATION).

Next, a semiconductor device will be described simply.

An epoxy resin molding material is prepared by mixing the above epoxy resin composition using a blender, kneading the mixed epoxy resin composition with being heated using a heating kneader, a heating roll or an extrude to obtain a kneading material, and then cooling and crushing the kneading material.

The semiconductor device can be manufactured by encapsulating electronic parts such as a semiconductor element using the above epoxy resin molding material. As for a method for encapsulating the electronic parts, conventional mold methods such as a transfer mold, a compression mold and an injection mold can be used.

EXAMPLES

The present invention will be described below in detail based on Examples and Comparative Examples, but is not limited thereto. It is to be noted that a blending amount is represented by weight part.

Example 1

Manufacturing of Epoxy Resin Molding Material

First, 15.28 weight parts of orthocresol novolak type epoxy resin (E-1: "EOCN1020" produced by Nippon Kayaku Co., Ltd., the softening point thereof was 55° C., and the epoxy equivalent thereof was 196) as epoxy resin; 8.02 weight parts of phenol novolak resin (H-1: "PR-HF-3" produced by SUMITOMO BAKELITE COMPAMY LIMITED, the softening point thereof was 80° C., and the hydroxyl equivalent thereof was 104) as a curing agent; 75 weight parts of spherical fused silica (the average particle size thereof was 26.5 μm, and the amount of particles each having a particle size of 105 μm or more was 1% or less) as an inorganic filler; 0.5 weight part of semicalcined hydrotalcite heat treated at 250° C. for 8 hours (P-1: $Mg_{4.3}Al_2(OH)_{12.6}(CO_3) \cdot mH_2O$, the pH buffer area thereof was 4.6, when the weight reduction rate thereof was measured using a thermogravimetry, the weight reduction rate at 250° C. (A) was 5.98 wt %, the weight reduction rate at 200° C. (B) was 4.05 wt % and the weight reduction rate at 450° C. (C) was 28.3 wt %, A-B was 1.93 wt %, C-A was 22.32 wt %, and the specific surface area thereof was 13 $m^2/g$) as a pH buffer agent; 0.3 weight part of carbon black; 0.2 weight part of epoxy silane (γ-glycidoxypropyltrimethoxysilane) as a silane coupling agent; 0.3 weight part of triphenylphosphine (TPP) as a curing accelerator; and 0.40 weight part of carnauba wax were prepared.

Next, these raw materials were mixed at room temperature using a blender to obtain a mixture. And then, the mixture was kneaded using a roll at 70 to 100° C. to obtain a kneading material. Thereafter, the kneading material was cooled and crushed to obtain an epoxy resin molding material.

The pH buffer area was evaluated as follows. First, a liquid solution was prepared by mixing 500 mg of the buffer agent, 225 mL of purified water and 25 mL of 1N—NaCl water solution. And then 25 mL of 1N—HCl was added to the liquid solution and the liquid solution was stirred. Next, the liquid solution was placed for 15 minutes, and then pH of the liquid solution was measured using a pH meter. Hereinafter, the pH buffer area was evaluated in the same manner as described above.

Examples 2 to 25

In each of Examples 2 to 25, an epoxy resin molding material was prepared in the same manner as the Example 1 except that combination of raw materials was changed as shown in Table 1. In this regard, it is to be noted that the kinds of the used raw materials were described below.

Epoxy Resin:

Biphenyl type epoxy resin (E-2: "YX-400" produced by Japan Epoxy Resins Co., Ltd., the epoxy equivalent thereof was 190, and the melting point thereof was 105° C.)

Phenol aralkyl type epoxy resin having biphenylene structures (E-3: "NC3000" produced by Nippon Kayaku Co., Ltd., the softening point thereof was 58° C., and the epoxy equivalent thereof was 274)

Curing Agent:

Phenol aralkyl resin (H-2: "XLC-4L" produced by Mitsui Chemicals, Inc., the softening point thereof was 62° C., and the hydroxyl equivalent thereof was 168)

Phenol aralkyl resin having biphenylene structures (H-3: "MEH-7851SS" produced by Meiwa Plastic Industries, Ltd., the softening point thereof was 65° C., and the hydroxyl equivalent thereof was 203)

pH Buffer Agent:

pH buffer agent (P-2): semicalcined hydrotalcite heat treated at 250° C. for 6 hours ($Mg_6Al_2(OH)_{16}(CO_3) \cdot mH_2O$, the pH buffer area thereof was 4.7, when the weight reduction rate thereof was measured using a thermogravimetry, the weight reduction rate at 250° C. (A) was 13.23 wt %, the weight reduction rate at 200° C. (B) was 12.91 wt % and the weight reduction rate at 450° C. (C) was 33.2 wt %, A-B was 0.32 wt %, C-A was 19.97 wt %, and the specific surface area thereof was 11 $m^2/g$)

pH buffer agent (P-3): semicalcined hydrotalcite heat treated at 350° C. for 4 hours $(Mg_6Al_2(OH)_{16}(CO_3).mH_2O$, the pH buffer area thereof was 4.6, when the weight reduction rate thereof was measured using a thermogravimetry, the weight reduction rate at 250° C. (A) was 4.82 wt %, the weight reduction rate at 200° C. (B) was 4.54 wt % and the weight reduction rate at 450° C. (C) was 23.7 wt %, A-B was 0.29 wt %, C-A was 18.88 wt %, and the specific surface area thereof was 15 m$^2$/g)

pH buffer agent (P-4): semicalcined hydrotalcite heat treated at 250° C for 16 hours $(Mg_3ZnAl_2(OH)_{12}(CO_3).mH_2O$, the pH buffer area thereof was 4.3, when the weight reduction rate thereof was measured using a thermogravimetry, the weight reduction rate at 250° C. (A) was 6.07 wt %, the weight reduction rate at 200° C. (B) was 4.30 wt % and the weight reduction rate at 450° C. (C) was 24.8 wt %, A-B was 1.78 wt %, C-A was 18.73 wt %, and the specific surface area thereof was 14 m$^2$/g)

pH buffer agent (P-4.5): semicalcined hydrotalcite heat treated at 230° C. for 1 hour $(Mg_6Al_2(OH)_{16}(CO_3).mH_2O$, the pH buffer area thereof was 5.5, when the weight reduction rate thereof was measured using a thermogravimetry, the weight reduction rate at 250° C. (A) was 8.76 wt %, the weight reduction rate at 200° C. (B) was 4.12 wt % and the weight reduction rate at 450° C. (C) was 35.4 wt %, A-B was 4.64 wt %, C-A was 26.64 wt %, and the specific surface area thereof was 12 m$^2$/g)

Comparative Example 1

Manufacturing of Epoxy Resin Molding Material

First, 15.61 weight parts of orthocresol novolak type epoxy resin (E-1: "EOCN1020" produced by Nippon Kayaku Co., Ltd., the softening point thereof was 55° C., and the epoxy equivalent thereof was 196) as epoxy resin; 8.19 weight parts of phenol novolak resin (H-1: "PR-HF-3" produced by SUMITOMO BAKELITE COMPAMY LIMITED, the softening point thereof was 80° C., and the hydroxyl equivalent thereof was 104) as a curing agent; 75 weight parts of spherical fused silica (the average particle size thereof was 26.5 μm, and the amount of particles each having a particle size of 105 μm or more was 1% or less) as an inorganic filler; 0.3 weight part of carbon black; 0.2 weight part of epoxy silane (γ-glycidoxypropyltrimethoxysilane) as a silane coupling agent; 0.3 weight part of triphenylphosphine (TPP) as a curing accelerator; and 0.40 weight part of carnauba wax were prepared. In this regard, in Comparative Example 1 a pH buffer agent was not used.

Next, these raw materials were mixed at room temperature using a blender to obtain a mixture. And then, the mixture was kneaded using a roll at 70 to 100° C. to obtain a kneading material. Thereafter, the kneading material was cooled and crushed to obtain an epoxy resin molding material.

Comparative Examples 2 to 11

In each of Comparative Examples 2 to 11, an epoxy resin molding material was prepared in the same manner as the Example 1 except that combination of raw materials was changed as shown in Table 1. In this regard, it is to be noted that the kinds of the used raw materials were described below with the same raw materials described above being omitted.

pH Buffer Agent:

pH buffer agent (P-5): semicalcined hydrotalcite heat treated at 200° C. for 20 hours $(Mg_{4.3}Al_2(OH)_{12.6}(CO_3).mH_2O$, the pH buffer area thereof was 3.4, when the weight reduction rate thereof was measured using a thermogravimetry, the weight reduction rate at 250° C. (A) was 13.95 wt %, the weight reduction rate at 200° C. (B) was 4.85 wt %, and A-B was 9.09 wt %)

pH buffer agent (P-6): semicalcined hydrotalcite heat treated at 125° C. for 1 hour $(Mg_6Al_2(OH)_{16}(CO_3).mH_2O$, the pH buffer area thereof was 3.2, when the weight reduction rate thereof was measured using a thermogravimetry, the weight reduction rate at 250° C. (A) was 12.96 wt %, the weight reduction rate at 200° C. (B) was 3.84 wt %, and A-B was 9.13 wt %) pH buffer agent (P-7): calcined hydrotalcite heat treated at 500° C. for 10 hours $(Mg_{4.3}Al_2(OH)_{12.6}(CO_3).mH_2O$, the pH buffer area thereof was 9.2, when the weight reduction rate thereof was measured using a thermogravimetry, the weight reduction rate at 250° c. (A) was 4.98 wt %, the weight reduction rate at 200° C. (B) was 3.89 wt % and the weight reduction rate at 450° C. (C) was 9.10 wt %, A-B was 1.09 wt %, and C-A was 4.12 wt %)

pH buffer agent (P-8): calcined hydrotalcite heat treated at 550° C. for 10 hours $(Mg_6Al_2(OH)_{16}(CO_3).mH_2O$, the pH buffer area thereof was 9.5, when the weight reduction rate thereof was measured using a thermogravimetry, the weight reduction rate at 250° C. (A) was 4.71 wt %, the weight reduction rate at 200° C. (B) was 3.97 wt % and the weight reduction rate at 450° C. (C) was 6.31 wt %, A-B was 0.74 wt %, and C-A was 1.60 wt %)

pH buffer agent (P-9): calcined hydrotalcite heat treated at 450° C. for 3 hours $(Mg_3ZnAl_2(OH)_{12}(Co_3).mH_2O$, the pH buffer area thereof was 9.0, when the weight reduction rate thereof was measured using a thermogravimetry, the weight reduction rate at 250° C. (A) was 5.03 wt %, the weight reduction rate at 200° C. (B) was 4.14 wt % and the weight reduction rate at 450° C. (C) was 9.37 wt %, A-B was 0.89 wt %, and C-A was 4.34 wt %)

pH buffer agent (P-10): calcium carbonate ("NS-100" produced by NITTO FUNKA K.K., the specific surface area thereof was 11000 cm$^2$/g, and the pH buffer area thereof was 7.2)

pH buffer agent (P-11): magnesium silicate ("Kyoward600" produced by Kyowa Chemical Industry Co., Ltd., 14.3% of MgO and 64.8% of SiO$_2$ were contained therein, and the pH buffer area thereof was 8.2)

pH buffer agent (P-12): magnesium carbonate ("magnesium carbonate goldstar" produced by Konoshima Chemical Co., Ltd., the ignition loss thereof was 54.0%, 42.6% of MgO was contained therein, and the pH buffer area thereof was 9.3)

The epoxy resin molding materials obtained in the Examples and the Comparative Examples were evaluated as follows. These results are shown in Table 1.

1. Coefficient of Moisture Absorption

Each of the obtained epoxy resin compositions was molded into a disc-like speciment having a diameter of 50 mm and a thickness of 3 mm by means of a low-pressure transfer mold machine under conditions that a mold temperature was 175° C., a transfer pressure was 9.8 MPa, and a curing time was 120 seconds.

Further, for a postcure, the obtained sample was heat treated at 175° C. for 8 hours. Thereafter, the sample was placed under conditions that a temperature was 85° C., and a relative humidity was 60% for 168 hours, and then the weight of the sample after moisture absorption was measured.

A coefficient of moisture absorption was calculated based on the weight of the sample before and after moisture absorption and shown on percentage. In this regard, the unit is wt %.

2. Solder Resistance

Using each of the obtained epoxy resin compositions, 6 packages (semiconductor devices) were manufactured by means of a low-pressure transfer mold machine under conditions that a mold temperature was 175° C., a transfer pressure was 9.8 MPa, and a curing time was 120 seconds. In this regard, each of the packages was formed into 80pQFP having a thickness of 2.0 mm and a chip size of 6.0 mm×6.0 mm. Further, for a postcure, the obtained packages were heat treated at 175° C. for 8 hours.

The packages were placed under conditions that a temperature was 30° C., and a relative humidity was 60% for 192 hours, and then were subjected to an IR reflow treatment at 240° C. Thereafter, whether delamination or crack inside each package exists or not was checked using a scanning acoustic tomograph. And a package having the delamination or crack therein was defined as a defective product, and the number of the defective product was counted. The number of the defective product "n" is shown as "n/6" in Table 1.

3. Moisture Resistance

Using each of the obtained epoxy resin compositions, 15 packages (semiconductor devices) were manufactured by means of a low-pressure transfer mold machine under conditions that a mold temperature was 175° C., a transfer pressure was 9.8 MPa, and a curing time was 120 seconds. In this regard, each of the packages was formed into 16pSOP having a chip size of 3.0 mm×3.5 mm. Further, for a postcure, the obtained packages were heat treated at 175° C. for 4 hours.

The packages were subjected to a pressure cooker test under conditions that a temperature was 140° C., a pressure was 1×10$^5$ Pa, and a time was 500 hours, and then open defect in circuit was measured. In Table 1, the number of the package effective product) having the open defect is shown.

TABLE 1

| No. | Ex. 1 | Ex. 2 | Ex. 3 | Ex. 4 | Ex. 5 | Ex. 6 | Ex. 7 | Ex. 8 | Ex. 9 | Ex. 10 | Ex. 9' | Ex. 10' | Ex. 11 | Ex. 12 |
|---|---|---|---|---|---|---|---|---|---|---|---|---|---|---|
| E-1 | 15.28 | | | | | 15.28 | | | | | | | 15.28 | |
| E-2 | | 4.45 | 3.67 | | | | 4.45 | 3.67 | | | | | | 4.45 |
| E-3 | | | | 8.03 | 6.82 | | | | 8.03 | 6.82 | 8.03 | 6.82 | | |
| H-1 | 8.02 | | | | | 8.02 | | | | | | | 8.02 | |
| H-2 | | 4.05 | 3.33 | | | | 4.05 | 3.33 | | | | | | 4.05 |
| H-3 | | | | 4.92 | 4.18 | | | | 4.92 | 4.18 | 4.92 | 4.18 | | |
| Spherical Fused Silica | 75.00 | 90.00 | 90.00 | 86.00 | 86.00 | 75.00 | 90.00 | 90.00 | 86.00 | 86.00 | 86.02 | 85.50 | 75.00 | 90.00 |
| P-1 | 0.50 | 0.50 | 2.00 | 0.05 | 2.00 | | | | | | | | | |
| P-2 | | | | | | 0.50 | 0.50 | 2.00 | 0.05 | 2.00 | 0.03 | 2.50 | | |
| P-3 | | | | | | | | | | | | | 0.50 | 0.50 |
| P-4 | | | | | | | | | | | | | | |
| P-4.5 | | | | | | | | | | | | | | |
| Carbon Black | 0.30 | 0.30 | 0.30 | 0.30 | 0.30 | 0.30 | 0.30 | 0.30 | 0.30 | 0.30 | 0.30 | 0.30 | 0.30 | 0.30 |
| Epoxy Silane | 0.20 | 0.20 | 0.20 | 0.20 | 0.20 | 0.20 | 0.20 | 0.20 | 0.20 | 0.20 | 0.20 | 0.20 | 0.20 | 0.20 |
| TPP | 0.30 | 0.10 | 0.10 | 0.10 | 0.10 | 0.30 | 0.10 | 0.10 | 0.10 | 0.10 | 0.10 | 0.10 | 0.30 | 0.10 |
| Carnauba Wax | 0.40 | 0.40 | 0.40 | 0.40 | 0.40 | 0.40 | 0.40 | 0.40 | 0.40 | 0.40 | 0.40 | 0.40 | 0.40 | 0.40 |
| pH Buffer Area | | | 4.6 | | | | | | 4.7 | | | | 4.6 | |
| Coefficient of Moisture Absorption (%) | 0.18 | 0.08 | 0.10 | 0.11 | 0.14 | 0.19 | 0.09 | 0.10 | 0.11 | 0.14 | 0.10 | 0.15 | 0.18 | 0.08 |
| Solder Crack Resistance (number of defective product/total number) | 1/6 | 0/6 | 0/6 | 0/6 | 1/6 | 0/6 | 0/6 | 0/6 | 0/6 | 1/6 | 0/6 | 1/6 | 1/6 | 0/6 |
| Moisture Resistance (number of defective product) | 1 | 0 | 0 | 2 | 0 | 0 | 0 | 0 | 0 | 0 | 0 | 0 | 0 | 0 |

| No. | Ex. 13 | Ex. 14 | Ex. 15 | Ex. 16 | Ex. 17 | Ex. 18 | Ex. 19 | Ex. 20 | Ex. 21 | Ex. 22 | Ex. 23 | Ex. 24 | Ex. 25 |
|---|---|---|---|---|---|---|---|---|---|---|---|---|---|
| E-1 | | | | 15.28 | | | | | 15.28 | | | | |
| E-2 | 3.67 | | | | 4.45 | 3.67 | | | | 4.45 | 3.67 | | |
| E-3 | | 8.03 | 6.82 | | | | 8.03 | 6.82 | | | | 8.03 | 6.82 |
| H-1 | | | | 8.02 | | | | | 8.02 | | | | |
| H-2 | 3.33 | | | | 4.05 | 3.33 | | | | 4.05 | 3.33 | | |
| H-3 | | 4.92 | 4.18 | | | | 4.92 | 4.18 | | | | 4.92 | 4.18 |
| Spherical Fused Silica | 90.00 | 86.00 | 86.00 | 75.00 | 90.00 | 90.00 | 86.00 | 86.00 | 75.00 | 90.00 | 90.00 | 86.00 | 86.00 |
| P-1 | | | | | | | | | | | | | |
| P-2 | | | | | | | | | | | | | |
| P-3 | 2.00 | 0.05 | 2.00 | | | | | | | | | | |
| P-4 | | | | 0.50 | 0.50 | 2.00 | 0.05 | 2.00 | | | | | |
| P-4.5 | | | | | | | | | 0.50 | 0.50 | 2.00 | 0.05 | 2.00 |
| Carbon Black | 0.30 | 0.30 | 0.30 | 0.30 | 0.30 | 0.30 | 0.30 | 0.30 | 0.30 | 0.30 | 0.30 | 0.30 | 0.30 |
| Epoxy Silane | 0.20 | 0.20 | 0.20 | 0.20 | 0.20 | 0.20 | 0.20 | 0.20 | 0.20 | 0.20 | 0.20 | 0.20 | 0.20 |
| TPP | 0.10 | 0.10 | 0.10 | 0.30 | 0.10 | 0.10 | 0.10 | 0.10 | 0.30 | 0.10 | 0.10 | 0.10 | 0.10 |
| Carnauba Wax | 0.40 | 0.40 | 0.40 | 0.40 | 0.40 | 0.40 | 0.40 | 0.40 | 0.40 | 0.40 | 0.40 | 0.40 | 0.40 |
| pH Buffer Area | | 4.6 | | | | 4.3 | | | | | 5.5 | | |
| Coefficient of Moisture Absorption (%) | 0.10 | 0.12 | 0.13 | 0.17 | 0.08 | 0.10 | 0.10 | 0.12 | 0.17 | 0.08 | 0.09 | 0.10 | 0.11 |
| Solder Crack Resistance (number of | 1/6 | 0/6 | 0/6 | 0/6 | 0/6 | 0/6 | 0/6 | 0/6 | 0/6 | 0/6 | 0/6 | 0/6 | 0/6 |

TABLE 1-continued

| | | | | | | | | | | | | |
|---|---|---|---|---|---|---|---|---|---|---|---|---|
| defective product/total number) | | | | | | | | | | | | |
| Moisture Resistance (number of defective product) | 0 | 1 | 0 | 1 | 0 | 0 | 1 | 0 | 2 | 2 | 1 | 2 | 1 |

| No. | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 | Comp. Ex. 10 | Comp. Ex. 11 |
|---|---|---|---|---|---|---|---|---|---|---|---|
| E-1 | 15.61 | | | | | | | | | | |
| E-2 | | 4.72 | | | | | | | | | |
| E-3 | | | 8.06 | 6.82 | 6.82 | 6.82 | 6.82 | 6.82 | 6.82 | 6.82 | 6.82 |
| H-1 | 8.19 | | | | | | | | | | |
| H-2 | | 4.28 | | | | | | | | | |
| H-3 | | | 4.94 | 4.18 | 4.18 | 4.18 | 4.18 | 4.18 | 4.18 | 4.18 | 4.18 |
| Spherical Fused Silica | 75.00 | 90.00 | 86.00 | 86.00 | 86.00 | 86.00 | 86.00 | 86.00 | 86.00 | 86.00 | 86.00 |
| P-1 | | | | | | | | | | | |
| P-2 | | | | | | | | | | | |
| P-3 | | | | | | | | | | | |
| P-5 | | | | 2.00 | | | | | | | |
| P-6 | | | | | 2.00 | | | | | | |
| P-7 | | | | | | 2.00 | | | | | |
| P-8 | | | | | | | 2.00 | | | | |
| P-9 | | | | | | | | 2.00 | | | |
| P-10 | | | | | | | | | 2.00 | | |
| P-11 | | | | | | | | | | 2.00 | |
| P-12 | | | | | | | | | | | 2.00 |
| Carbon Black | 0.30 | 0.30 | 0.30 | 0.30 | 0.30 | 0.30 | 0.30 | 0.30 | 0.30 | 0.30 | 0.30 |
| Epoxy Silane | 0.20 | 0.20 | 0.20 | 0.20 | 0.20 | 0.20 | 0.20 | 0.20 | 0.20 | 0.20 | 0.20 |
| TPP | 0.30 | 0.10 | 0.10 | 0.10 | 0.10 | 0.10 | 0.10 | 0.10 | 0.10 | 0.10 | 0.10 |
| Carnauba Wax | 0.40 | 0.40 | 0.40 | 0.40 | 0.40 | 0.40 | 0.40 | 0.40 | 0.40 | 0.40 | 0.40 |
| pH Buffer Area | — | — | — | 3.4 | 3.2 | 9.2 | 9.5 | 9.0 | 7.2 | 8.2 | 9.3 |
| Coefficient of Moisture Absorption (%) | 0.14 | 0.08 | 0.10 | 0.14 | 0.15 | 0.15 | 0.14 | 0.14 | 0.13 | 0.13 | 0.13 |
| Solder Crack Resistance (number of defective product/total number) | 0/6 | 1/6 | 0/6 | 1/6 | 0/6 | 1/6 | 1/6 | 0/6 | 0/6 | 0/6 | 1/6 |
| Moisture Resistance (number of defective product) | 15 | 15 | 15 | 15 | 14 | 15 | 15 | 14 | 15 | 15 | 14 |

As is apparent from Table 1, all of the samples and packages manufactured in the Examples 1 to 25 had low coefficient of moisture absorption and excellent moisture resistance.

Further, all of the packages manufactured in Examples 2 to 4, 6 to 9, 9', 12 and 14 to 25 had especially excellent solder crack resistance.

As described above, in the case where a semiconductor element is encapsulated using the epoxy resin composition of the present invention, a semiconductor device having excellent moisture resistance can be obtained.

Further, according to the present invention, it is possible to manufacture a semiconductor device having excellent solder reflow resistance and moisture resistance which could not be obtained conventionally. Therefore, the semiconductor device of the present invention can be preferably applied to devices to be used in the open air such as apparatus to be mounted on a car which needs to have high moisture resistance.

Finally, it is also to be understood that the present disclosure relates to subject matter contained in Japanese Patent Application No. 2006-274564 filed on Oct. 6, 2006 which is expressly incorporated herein by reference in its entirety.

What is claimed is:

1. An epoxy resin composition for encapsulating a semiconductor element, comprising:
    phenol aralkyl type epoxy resin;
    a curing agent;
    at least one kind of an inorganic filler selected from the group consisting of silicates of talc and calcined clay, oxides of silica and fused silica, and hydroxides of aluminum hydroxide and magnesium hydroxide, wherein the inorganic filler includes coarse particles having a particle size of 105 µm or more, and an amount of the coarse particles is 1% or less; and
    a pH buffer agent having a pH buffer area of pH 4 to 8, wherein the pH buffer agent is hydrotalcite represented by the following chemical formula: $Mg_3ZnAl_2(OH)_{12}(CO_3) \cdot mH_2O$ and m is an integer of 0 or more, and the specific surface area of the hydrotalcite is in the range of 35 to 60 $m^2/g$.

2. The epoxy resin composition as claimed in claim 1, wherein the hydrotalcite contains semicalcined hydrotalcite.

3. The epoxy resin composition as claimed in claim 1, wherein when a weight reduction rate of the hydrotalcite is measured using a thermogravimetry, and then the weight reduction rate at 250° C. is defined by A wt % and the weight reduction rate at 200° C. is defined by B wt %, A and B satisfy a relation of $A-B \leqq 5$ wt %.

4. The epoxy resin composition as claimed in claim 3, wherein when the weight reduction rate at 450° C. is defined by C wt %, A and C satisfy a relation of $C-A \geqq 5$ wt %.

5. The epoxy resin composition as claimed in claim 1, wherein the hydrotalcite has a plurality of layers in a crystal thereof, an amount of water existing between the layers is 5 wt % or less, and an amount of carbonate ions existing between the layers is 5 wt % or more.

6. The epoxy resin composition as claimed in claim 1, wherein the hydrotalcite is subjected in advance to a heat treatment under conditions that a temperature is in the range of 200 to 400° C. and a time is in the range of 30 minutes to 24 hours.

7. The epoxy resin composition as claimed in claim 1, wherein an amount of the pH buffer agent in the entirety of the epoxy resin composition is in the range of 0.01 to 3 wt %.

8. The epoxy resin composition as claimed in claim 1, wherein when the epoxy resin composition is cured to obtain a cured product thereof, the cured product is subjected to an extraction operation using water which is heated, and then pH of the water after the extraction operation is measured, the pH of the water is in the range of 4 to 9.

9. A semiconductor device manufactured by encapsulating at least one semiconductor element with a cured product of the epoxy resin composition claimed in claim 1.

10. The epoxy resin composition as claimed in claim 1, wherein the phenol aralkyl type epoxy resin has biphenylene structures.

* * * * *